(12) United States Patent
Baba et al.

(10) Patent No.: US 6,737,687 B2
(45) Date of Patent: May 18, 2004

(54) FIELD-EFFECT TRANSISTOR DEVICE HAVING A UNIQUELY ARRANGED GATE ELECTRODE

(75) Inventors: Takahiro Baba, Yokohama (JP); Koichi Sakamoto, Yokohama (JP); Shigeyuki Mikami, Yokohama (JP); Hiroyasu Matsuzaki, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/359,204

(22) Filed: Feb. 6, 2003

(65) Prior Publication Data

US 2003/0160279 A1 Aug. 28, 2003

(30) Foreign Application Priority Data

Feb. 27, 2002 (JP) .......................... 2002-051733

(51) Int. Cl.$^7$ .................... H01L 29/80; H01L 31/112
(52) U.S. Cl. .................... 257/276; 331/96; 257/275; 257/277
(58) Field of Search ................ 257/275–277, 257/664, 728; 333/161, 164, 204, 247

(56) References Cited

U.S. PATENT DOCUMENTS 5,821,815 A * 10/1998 Mohwinkel .................. 330/286

FOREIGN PATENT DOCUMENTS

| JP | 60106205 A | * 6/1985 |
| JP | 60153602 A | * 8/1985 |
| JP | 63-164504 | 7/1988 |

* cited by examiner

Primary Examiner—Minhloan Tran
Assistant Examiner—Thomas L Dickey
(74) Attorney, Agent, or Firm—Keating & Bennett LLP

(57) ABSTRACT

A field-effect transistor device includes an active area on a semiconductor substrate and a gate electrode, a source electrode, and a drain electrode are disposed on the surface of the active area, so as to define an FET portion. An electrode defining a line for connection to the gate, an electrode defining a line for connection to the source, and an electrode defining a line for connection to the drain are disposed on the semiconductor substrate. The electrodes define a slot line on the input side for supplying a signal to the FET portion, and a slot line on the output side from which a signal of the FET portion is output. The gate electrode has a shape which extends along the direction that approximately perpendicular to the conduction direction of the signal through the slot line on the input side.

18 Claims, 8 Drawing Sheets

FIELD-EFFECT TRANSISTOR DEVICE HAVING A UNIQUELY ARRANGED GATE ELECTRODE

BACKGROUND OF THE INVENTION

1. Field of the Invention

The present invention relates to field-effect transistor devices incorporated in, for example, amplifier circuits, oscillation circuits, and other electronic apparatuses.

2. Description of the Related Art

FIG. 8A is a schematic plan view showing an example of a field-effect transistor device (FET device) FIG. 8B is a schematic sectional view taken along the line A—A of the FET device of FIG. 8A as disclosed in Japanese Unexamined Patent Application Publication No. 63-164504. An FET device 30 of FIGS. 8A and 8B has a semiconductor substrate 31 made of GaAs, etc., and impurity ions, such as $Si^+$, are implanted into the central portion of the semiconductor substrate 31, so as to form an active layer 32. A gate electrode 33 is formed on the surface of the active layer 32, and also, a source electrode 34 and a drain electrode 35 are formed so as to sandwich the gate electrode 33 with a space defined therebetween. The active layer 32, the gate electrode 33, the source electrode 34, and the drain electrode 35 define an FET portion.

On the surface of the semiconductor substrate 31, an electrode 36 used for a line to make a connection to the gate, connected to the gate electrode 33, is formed at the upper left portion of FIG. 8A. An electrode 37 used for a line to make a connection to the source, connected to the source electrode 34, is formed at the upper right portion of FIG. 8A. Furthermore, an electrode 38 used for a line to make a connection to the drain, connected to the drain electrode 35, is formed at the lower half portion of FIG. 8A.

The gate-connection-line electrode 36, the source-connection-line electrode 37, and the drain-connection-line electrode 38 define a signal line connected to the FET portion. That is, the drain-connection-line electrode 38 is grounded. The drain-connection-line electrode 38 has a portion 38a opposing the gate-connection-line electrode 36 with a space defined therebetween, and a portion 38b opposing the source-connection-line electrode 37 with a space defined therebetween. An electrode pair 40 of electrode portion 3Ba and gate-connection-line electrode 36, and an electrode pair 41 of electrode portion 38b and source-connection-line electrode 37 each functions as a slot line. The electrode pair 40 defines a FET input line, and the electrode pair 41 defines a FET output line.

In this FET device 30, for example, when a signal is input to the gate electrode 33 via the FET input line 40, the signal amplified by the active layer 32 is output externally through the FET output line 41.

In the configuration of the FET device 30, the gate electrode 33 has a configuration that extends along the conduction direction of the signal. For this reason, a phase difference occurs between the signal at the base-end portion of the gate electrode 33 and the signal at the front-end portion of the gate electrode 33, and when a high-frequency signal flows, the phase difference cannot be ignored. For example, when the phase difference between the signal at the base-end portion of the gate electrode 33 and the signal at the front-end portion thereof is approximately $\lambda/4$ to $\lambda/2$, the signal which is amplified on the basis of the signal at the base-end portion of the gate electrode 33, and the signal which is amplified on the basis of the signal at the front-end portion become 180° out of phase with each other. As a result, portions of the signals amplified by the FET portion cancel each other, presenting a problem in that the gain (power amplification efficiency) of the FET portion is decreased.

SUMMARY OF THE INVENTION

In order to overcome the problems described above, preferred embodiments of the present invention provide a field-effect transistor device that is capable of increasing the gain without suffering the disadvantages and problems described above.

According to a preferred embodiment of the present invention, a field-effect transistor device includes a field-effect transistor portion including a gate electrode, a source electrode, and a drain electrode, the gate electrode being located on the surface of an active area located on a semiconductor substrate, and the source electrode and the drain electrode being arranged in such a manner so as to sandwich the gate electrode with a space provided therebetween; a gate-connection-line electrode defining a line for making a connection to the gate electrode; a source-connection-line electrode defining a line for making a connection to the source electrode, the gate-connection-line electrode and the source-connection-line electrode being arranged such that respective portions thereof oppose each other with a space provided therebetween; and an electrode used defining a line for making a connection to the drain electrode arranged in such a manner that a portion thereof opposes the gate-connection-line electrode with a space provided therebetween, the gate-connection-line electrode, the source-connection-line electrode, and the drain-connection-line electrode being disposed on the surface of the semiconductor substrate which is coplanar with respect to the surface on which the gate electrode, the source electrode, and the drain electrode are disposed, wherein one of the electrode pair portion where the gate-connection-line electrode opposes the source-connection-line electrode and the electrode pair portion where the gate-connection-line electrode opposes the drain-connection-line electrode functions as a slot line on the input side for inputting a signal to the field-effect transistor portion and the other of the electrode pair portion where the gate-connection-line electrode opposes the source-connection-line electrode and the electrode pair portion where the gate-connection-line electrode opposes the drain-connection-line electrode functions as a slot line on the output side from which a signal is output from the field-effect transistor portion, and wherein the gate electrode has a configuration which extends along a direction that is substantially perpendicular to the conduction direction of the signal flowing through the slot line on the input side or along a direction inclined with respect to the conduction direction of the signal flowing through the slot line on the input side.

The source-connection-line electrode and the drain-connection-line electrode may be arranged adjacent to each other with a space provided therebetween, and a cut-out portion may be formed in at least one of the electrode portion on the drain-connection-line electrode side in the source-connection-line electrode and the electrode portion on the source-connection-line electrode side in the drain-connection-line electrode. As a result, the space between the source-connection-line electrode and the drain-connection-line electrode is increased.

The slot line on the input side and the slot line on the output side may be arranged along approximately the same straight line and such that the field-effect transistor portion is disposed therebetween.

A plurality of sets of the gate electrode, the source electrode, and the drain electrode may be disposed on the same surface of the semiconductor substrate, the field-effect transistor device may include a plurality of field-effect transistor portions, and a slot line on the input side and a slot line on the output side, corresponding to each of the plurality of field-effect transistor portions, may be disposed on the semiconductor substrate.

An even number of field-effect transistor portions may be arranged with a space provided therebetween on the semiconductor substrate, and the entire electrode pattern of a plurality of sets of the gate electrode, the source electrode, and the drain electrode, the gate-connection-line electrode, the source-connection-line electrode, and the drain-connection-line electrode, which are disposed on the surface of the semiconductor substrate, may be arranged to have a pattern shape which is approximately line symmetrical with respect to the center line of that entire electrode pattern, which is substantially perpendicular to the direction in which the field-effect transistor portions are arranged.

According to various preferred embodiments of the present invention, since the gate electrode which is a constituent of the field-effect transistor portion preferably has a shape which extends along a direction normal to the conduction direction of the signal flowing through he slot line on the input side or along a direction inclined with respect to the conduction direction of the signal flowing through the slot line on the input side, it is possible to eliminate the phase difference of the signal within the gate electrode or possible to minimize the phase difference. As a result, it is possible to prevent a decrease in gain resulting from the phase difference of the signal within the gate electrode. As a result, a field-effect transistor device capable of amplifying the signal with efficiency can be provided.

On the semiconductor substrate which is a constituent of the field-effect transistor device, since a slot line on the input side for inputting a signal to the field-effect transistor portion is provided, for example, it is possible for the field-effect transistor device to receive the signal from the slot line of the circuit substrate on which that device is mounted via the slot line on the input side. Therefore, it is possible to reduce a signal connection loss at the portion where the field-effect transistor device and the circuit substrate are connected to each other. Furthermore, on the semiconductor substrate of the field-effect transistor device, since a slot line on the output side for outputting a signal of the field-effect transistor portion is provided, for example, it is possible for the field-effect transistor device to output an output signal from the slot line on the output side of that device to the slot line of the circuit substrate on which that device is mounted in a state in which a connection loss is reduced. In the manner described above, as a result of forming a slot line on the input side and a slot line on the output side on the semiconductor substrate of the field-effect transistor device, a signal connection loss is significantly reduced, and thus, the gain of the field-effect transistor device is further increased.

In preferred embodiments of the present invention, for the field-effect transistor device and the circuit substrate, since the slot lines can be bump-connected together so as to allow the conduction of the signal, a variation in impedance at the portion where the field-effect transistor device and the circuit substrate are connected on the signal conduction path can be minimized. As a result, it is possible to suppress the generation of unwanted waves resulting from a variation in impedance.

Furthermore, since the gate-connection-line electrode defines the slot line on the input side and also the slot line on the output side, the field-effect transistor device of preferred embodiments of the present invention can be used in circuits for which gate grounding is required.

Furthermore, in one preferred embodiment of the field-effect transistor device configured in such a manner that the source-connection-line electrode and the drain-connection-line electrode are arranged adjacent to each other with a space provided therebetween, by forming a cut-out portion in at least one of the electrode portion on the drain-connection-line electrode side in the source-connection-line electrode and the electrode portion on the source-connection-line electrode in the drain-connection-line electrode so as to increase the space between the source-connection-line electrode and the drain-connection-line electrode, the isolation between the source-connection-line electrode and the drain-connection-line electrode can be ensured. As a result, it is possible to prevent undesired coupling between the source-connection-line electrode and the drain-connection-line electrode, making it possible to prevent problems resulting from the undesired coupling, that is, problems such as electrical current passing between the source-connection-line electrode and the drain-connection-line electrode and a signal not being supplied to the field-effect transistor portion.

Furthermore, in one preferred embodiment of the field-effect transistor device configured such that the slot line on the input side and the slot line on the output side are arranged along approximately the same straight line with the portion where the field-effect transistor portion is disposed in between, a signal conduction loss can be minimized, and thus, the gain of the field-effect transistor device can easily be further increased.

In one preferred embodiment of the field-effect transistor device that has a plurality of field-effect transistor portions by being configured in such a manner that a plurality of sets of the gate electrodes, the source electrodes, and the drain electrodes are disposed on the same surface of the semiconductor substrate, in manufacturing steps, the plurality of sets of the gate electrode, the source electrode, and the drain electrode can be formed on the surface of the semiconductor substrate at the same time. Therefore, variations in the characteristics of the plurality of the field-effect transistor portions can be almost eliminated. As a result, for example, when a plurality of field-effect transistor portions is to be incorporated into a circuit, the design of the circuit can be made easier.

In addition, in one preferred embodiment of the field-effect transistor device configured in such a manner that, on the semiconductor substrate, an even number of field-effect transistor portions are arranged with a space provided therebetween and that the entire electrode pattern disposed on the surface of the semiconductor substrate is arranged to be line symmetrical with respect to the center line of that entire electrode pattern, which is substantially perpendicular to the direction in which the field-effect transistor portions are arranged, in a case where, for example, a signal output from each field-effect transistor portion of the field-effect transistor device is joined by the slot lines disposed on the circuit substrate, the harmonics of the even mode included in the output signal of each field-effect transistor portion cancel each other and can be eliminated. Due to the fact that the harmonics are one cause of the loss of the fundamental waves, since the harmonics of the even mode can be eliminated in the manner described above, it is possible to reduce the loss of the fundamental waves of the signal, and thus, the gain of the field-effect transistor device can be further increased.

Other features, elements, characteristics and advantages of the present invention will become more apparent from the following detailed description of preferred embodiments with reference to the attached drawings.

DETAILED DESCRIPTION OF PREFERRED EMBODIMENTS

Preferred embodiments of the present invention will now be described below with reference to the attached drawings.

Figure 1:
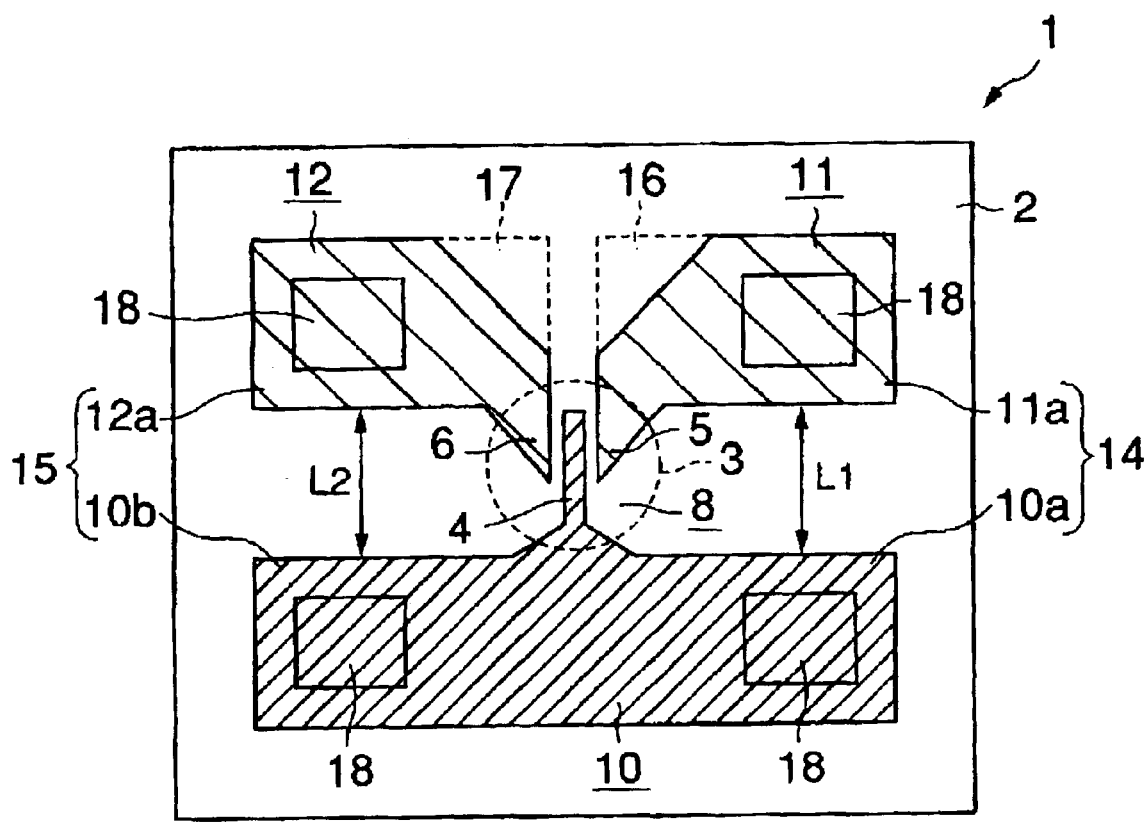
FIG. 1 is a plan view schematically showing features of an electrode pattern in a field-effect transistor device according to a first preferred embodiment of the present invention.

FIG. 1 shows in a plan view a field-effect transistor device according to a first preferred embodiment of the present invention. This field-effect transistor device (FET device) 1 can operate by being incorporated in an amplifier circuit or an oscillation circuit in which, for example, a high-frequency signal of a millimetric-wave band conducts. This FET device 1 preferably includes a semiconductor substrate 2, and an active area (intrinsic area) 3 is provided on this semiconductor substrate 2. In this first preferred embodiment, the active area 3 is located in the approximately central portion of the semiconductor substrate 2. On the surface of the active area 3, a gate electrode (gate finger) 4 is provided, and also, a source electrode 5 and a drain electrode 6 are arranged in such a manner so as to sandwich the gate electrode 4 with a space provided therebetween. The active area 3, the gate electrode 4, the source electrode 5, and the drain electrode 6 form a field-effect transistor portion (FET portion) 8.

Furthermore, on the surface of the semiconductor substrate 2, which is coplanar with the surface on which the gate electrode 4, the source electrode 5, and the drain electrode 6 are disposed, an electrode 10 used for a line to make a connection to the gate electrode 4, an electrode 11 used for a line to make a connection to the source electrode 5, and an electrode 12 used for a line to make a connection to the drain electrode 6 are provided.

In the first preferred embodiment, the source-connection-line electrode 11 is disposed at the upper right portion shown in FIG. 1, of the surface of the semiconductor substrate 2, the drain-connection-line electrode 12 is disposed at the upper left portion of FIG. 1, on the surface of the semiconductor substrate 2, and the source-connection-line electrode 11 and the drain-connection-line electrode 12 are arranged adjacent to each other with a space provided therebetween. Furthermore, the gate-connection-line electrode 10 is disposed at the lower half portion of FIG. 1, on the surface of the semiconductor substrate 2, a portion of the gate-connection-line electrode 10 opposes the source-connection-line electrode 11 with a space in between, and another portion thereof opposes the drain-connection-line electrode 12 with a space provided therebetween.

In this preferred embodiment, the gate-connection-line electrode 10 is defined by an electrode which is grounded, and a pair (electrode pair) 14 of opposing electrode portions 10a and 11a of the gate-connection-line electrode 10 and the source-connection-line electrode 11 functions as a slot line. Similarly, a pair (electrode pair) 15 of opposing electrode portions 10b and 12a of the gate-connection-line electrode 10 and the drain-connection-line electrode 12 also functions as a slot line.

In the first preferred embodiment, the space L1 between the electrode portions 10a and 11a which define the slot line 14, and the space L2 between the electrode portions 10b and 12a which define the slot line 15, are nearly equal. The slot lines 14 and 15 are arranged along approximately the same straight line with the FET portion 8 disposed therebetween.

For example, when a signal is input externally to such a slot line 14, the signal is supplied, via the slot line 14, between the gate electrode 4 and the source electrode 5 of the FET portion 8. As a result, an amplified signal is generated between the source electrode 5 and the drain electrode 6, and this amplified signal can be output externally through the slot line 15. In this manner, one of the slot lines 14 and 15 is arranged as a line on the input side for supplying a signal to the FET portion 8, and the other is arranged as a line on the output side from which a signal is output. In the first preferred embodiment, the conduction direction of the signal which flows through the slot lines 14 and 15 is the right and left direction in FIG. 1.

One of the most significant features of this first preferred embodiment is that the gate electrode 4 has a shape which extends along the direction normal to the conduction direction of the signal through the slot lines 14 and 15.

As described above, since the gate electrode 4 preferably has a shape which extends along the direction that is substantially perpendicular to the conduction direction of the signal, the phase of the signal becomes nearly in phase at any place of the gate electrode 4. For this reason, the amplified signal based on the signal at any place of the gate electrode 4 becomes nearly in phase. As a result, it is possible to eliminate the problem resulting from the phase difference of the signal within the gate electrode 4, that is, the state in which portions of the amplified signals are cancelled with each other and the gain is greatly decreased.

In recent years, there has been an increasing demand for a higher-frequency signal. As a result of the signal having a higher frequency, the decrease in gain resulting from the phase difference of the signal within the gate electrode has become a large problem. In the first preferred embodiment, since the problem of the gain being decreased, resulting from the phase difference of the signal within the gate electrode, can be overcome with a simple construction in which the gate electrode 4 having a shape which extends along the direction normal to the slot lines 14 and 15, this configuration holds great potential. Such a construction has not been available before, and is a significant breakthrough.

Furthermore, in the first preferred embodiment, since the gate-connection-line electrode 10 is capable of being grounded, it can be used in a circuit for which gate grounding is desired.

In the first preferred embodiment, the source-connection-line electrode 11 and the drain-connection-line electrode 12 are arranged adjacent to each other. For this reason, if the isolation between the source-connection-line electrode 11 and the drain-connection-line electrode 12 is insufficient, there are cases in which the source-connection-line electrode 11 and the drain-connection-line electrode 12 are undesirably coupled to each other. If, as a result of this undesired coupling, electrical current conducts between the source-connection-line electrode 11 and the drain-connection-line electrode 12, a state in which the slot line on the input side and the slot line on the output side are short-circuited is reached. As a result, the situation occurs in which the signal is not supplied to the FET portion 8 from the slot line on the input side or even if the signal is supplied to the FET portion 8, the amount of the supplied signal is small and tie gain is very low.

In the first preferred embodiment, in order to prevent the problem, cut-out portions 16 and 17 indicated by the dotted lines in FIG. 1 are formed in a portion of the source-connection-line electrode 11 on the drain-connection-line electrode side and a portion of the drain-connection-line electrode 12 on the source-connection-line electrode side, respectively. The cut-out portions 16 and 17 cause the space between the source-connection-line electrode 11 and the drain-connection-line electrode 12 to be increased, making it possible to prevent undesired coupling between the source-connection-line electrode 11 and the drain-connection-line electrode 12. As a result, it is possible to prevent a problem resulting from the above-described undesired coupling between the source-connection-line electrode 11 and the drain-connection-line electrode 12.

A protective film formed from an insulator is coated on the surface of the semiconductor substrate 2 in order to protect electrodes such as the gate electrode 4, and the slot lines 14 and 15 each are required to conduct externally. For this reason, openings 18 are formed in the protective film so that a portion of each of the gate-connection-line electrode 10, the source-connection-line electrode 11, and the drain-connection-line electrode 12, which form the slot lines 14 and 15, is exposed.

Figure 2:
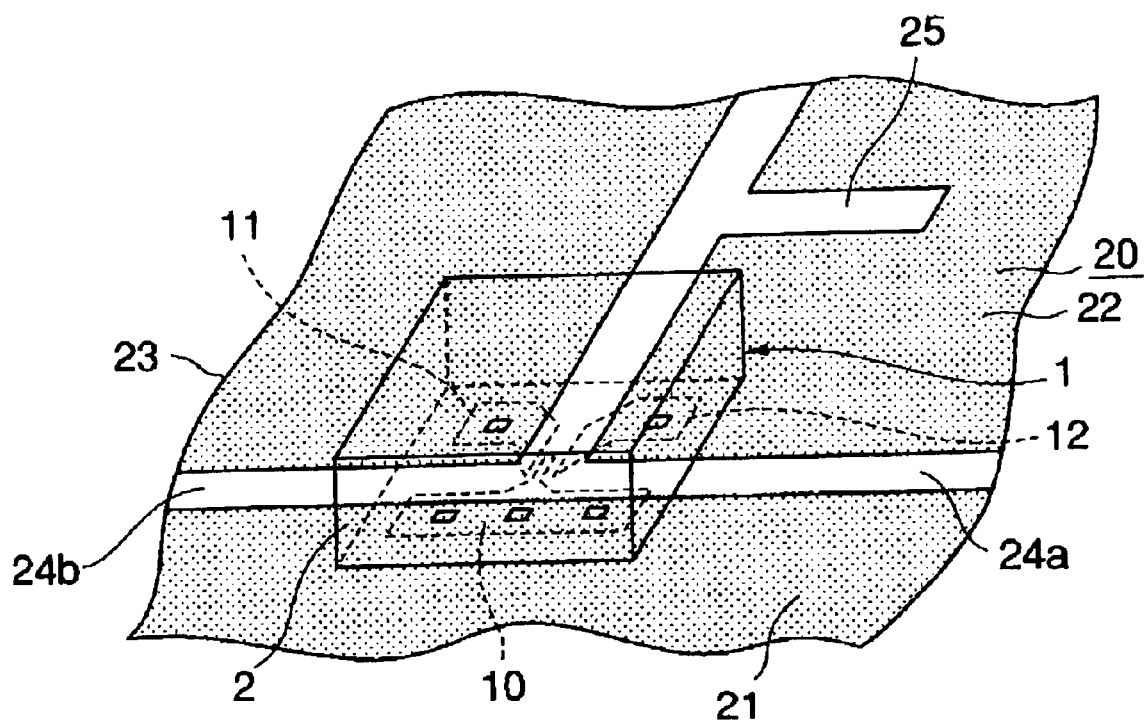
FIG. 2 shows in a simplified manner an example of a mounting structure of the field-effect transistor device according to the first preferred embodiment of the present invention.

FIG. 2 shows in a simplified manner an example of a mounting structure of the FET device 1 according to the first preferred embodiment of the present invention. The example of FIG. 2 shows a case in which the FET device 1 is incorporated in an amplifier circuit. In FIG. 2, on a circuit substrate 20 on which the FET device 1 is mounted, an electrode pattern which defines a slot line on the input side for supplying a signal to the FET device 1, and a slot line on the output side from which the output signal of the FET device 1 is output is formed. That is, a grounding electrode 21 which is grounded is disposed on the circuit substrate 20 made of a dielectric. Furthermore, an electrode 22 opposing the grounding electrode 21 with a space provided therebetween is disposed in a portion of the grounding electrode 21, and a slot line 24a is defined by the electrode pair of the grounding electrode 21 and the electrode 22. Furthermore, an electrode 23 opposing the grounding electrode 21 with a space provided therebetween is provided in another portion of the grounding electrode 21, and another slot line 24b is defined by the electrode pair of the grounding electrode 21 and the electrode 23.

When the electrode patterns 21, 22, and 23 are to be disposed on the surface of the circuit substrate 20 so as to define slot lines 24a and 24b, electrodes are often not formed on the rear area of the circuit substrate 20 that opposes the electrode-pattern-formed area. However, in the first preferred embodiment, electrodes may be disposed on the rear area of the circuit substrate 20, and the presence or absence of electrodes on the rear area of the circuit substrate 20 is not particularly limited.

One of the slot line 24a defined by the grounding electrode 21 and the electrode 22 of the circuit substrate 20, and the slot line 24b defined of the grounding electrode 21 and the electrode 23 is defined as a line on the input side which supplies a signal to the FET device 1, and the other is defined as a line on the output side from which the output signal of the FET device 1 is output.

For mounting the FET device 1 on the circuit substrate 20, the FET device 1 is mounted on the circuit substrate 20 in such a manner that the slot line on the input side of the FET device 1 is connected to the slot line on the input side of the circuit substrate 20 and that the slot line on the output side of the FET device 1 is connected to the slot line on the output side of the circuit substrate 20. For example, in the example of FIG. 2, the gate-connection-line electrode 10 is connected to the grounding electrode 21 of the circuit substrate 20, the source-connection-line electrode 11 is connected to the electrode 23 of the circuit substrate 20, and the drain-connection-line electrode 12 is connected to the electrode 22 of the circuit substrate 20, each being connected with solder in between at the position of the opening 18. As a result, the slot line 14 of the FET device 1 is connected to the slot line 24b of the circuit substrate 20, and the slot line 15 of the FET device 1 is connected to the slot line 24a of the circuit substrate 20. The area of the circuit substrate 20 opposing the FET portion 8 of the FET device 1 when the FET device 1 is mounted on the circuit substrate 20 is formed as an electrode-pattern-free area.

The electrodes 22 and 23 disposed on the circuit substrate 20 are arranged adjacent to each other. As described above, one of the electrodes 22 and 23 is one of the electrodes which define the slot line on the input side of the circuit substrate 20, and the other is one of the electrodes which define the slot line on the output side of the circuit substrate 20 When the electrodes 22 and 23 are undesirably coupled to with each other, electrical current conducts between the electrodes 22 and 23, and therefore, a signal does not flow from the slot line on the input side of the circuit substrate 20 to the slot line on the input side of the FET device 1. As a result, the problem of not being able to supply a signal from the circuit substrate 20 side to the FET portion 8 of the FET device 1 occurs.

In order to prevent such a problem, a slot line is formed by the electrodes 22 and 23. Here, an example in which the FET device 1 is incorporated in an amplifier circuit is shown. In this case, when the slot line formed by the electrodes 22 and 23 is viewed from the FET portion 8 side, the slot line is preferably in a state equivalent to an open state. For this reason, in the first preferred embodiment, a short stub 25 of approximately $\lambda/4$ is formed in the slot line defined by the electrodes 22 and 23 at a position that is approximately $\lambda/2$ from the end portion on the FET portion 8 side. As a result, the slot line defined by the electrodes 22 and 23 reaches a state equivalent to an open state when viewed from the FET portion 8 side.

As a result of providing the slot line defined by the pair of electrodes 22 and 23, it is possible to prevent the slot line 24a and 24b on the input and output sides disposed on the circuit substrate 20 from becoming short-circuited, and thus, it is possible to reliably supply a signal from the circuit substrate 20 side to the FET device 1 side.

In the first preferred embodiment, an example in which the FET device 1 is incorporated in an amplifier circuit is described. In the slot line defined by the electrodes 22 and 23 disposed on the circuit substrate 20, the short stub 25 of approximately λ/4 is disposed at the position that is approximately λ/2 from the end portion on the FET portion 8 side of the slot line so that the slot line becomes open when the slot line is viewed from the FET portion 8. However, for example, when the FET device 1 is to be incorporated in a reflection oscillation circuit disposed on the circuit substrate 20, the slot line defined by the electrodes 22 and 23 when viewed from the FET portion 8 may not be open. In this case, the short stub 25 may not be provided at the location that is approximately λ/2 from the end portion of that slot line on the FET portion 8 side. As discussed above, the position at which the short stub 25 is provided, or whether or not the short stub 25 should be provided, is appropriately set according to the circuit configuration of the circuit substrate 20 in which the FET device 1 is incorporated, and is not limited to the configuration of the first preferred embodiment of the present invention.

In the first preferred embodiment, as described above, the slot line on the input side is provided in the FET device 1, and the slot line on the input side of the FET device 1 is connected to the slot line on the input side of the circuit substrate 20 via solder. For this reason, the FET device 1 receives the signal from the slot line on the input side of the circuit substrate 20 via the solder by the slot line. Similarly, the slot line on the output side is provided in the FET device 1, and the slot line on the output side of the FET device 1 is connected to the slot line on the output side of the circuit substrate 20 via solder. For this reason, the FET device 1 outputs the output signal to the slot line on the output side of the circuit substrate 20 from the slot line on the output side via the solder.

As discussed above, since the FET device 1 and the circuit substrate 20 are configured in such a manner that the slot lines are soldered together to allow the signal to be exchanged, it is possible to reduce a signal connection loss, and thus the gain of the FET device 1 can be increased.

Since the FET device 1 and the circuit substrate 20 are configured in such a manner that the slot lines are soldered together to allow the signal to be exchanged, it is possible to reduce a variation in impedance at the portion where the FET device 1 and the circuit substrate 20 are connected to each other on the signal path. If a variation in impedance at the portion where the FET device 1 and the circuit substrate 20 are connected on the signal path is large, unwanted waves of an unwanted propagation mode, such as a parallel-plate mode or a surface-acoustic-wave mode, other than a slot mode, is generated at the portion where the FET device 1 and the circuit substrate 20 are connected to each other. However, in the first preferred embodiment, as described above, since a variation in impedance at the portion where the FET device 1 and the circuit substrate 20 are connected to each other on the signal path can be reduced, generation of unwanted waves is reliably prevented.

A second preferred embodiment of the present invention will now be described below. In the description of this second preferred embodiment, components which are the same as those in the first preferred embodiment are designated with the same reference numerals, and accordingly, duplicate descriptions of the components are omitted.

Figure 3:
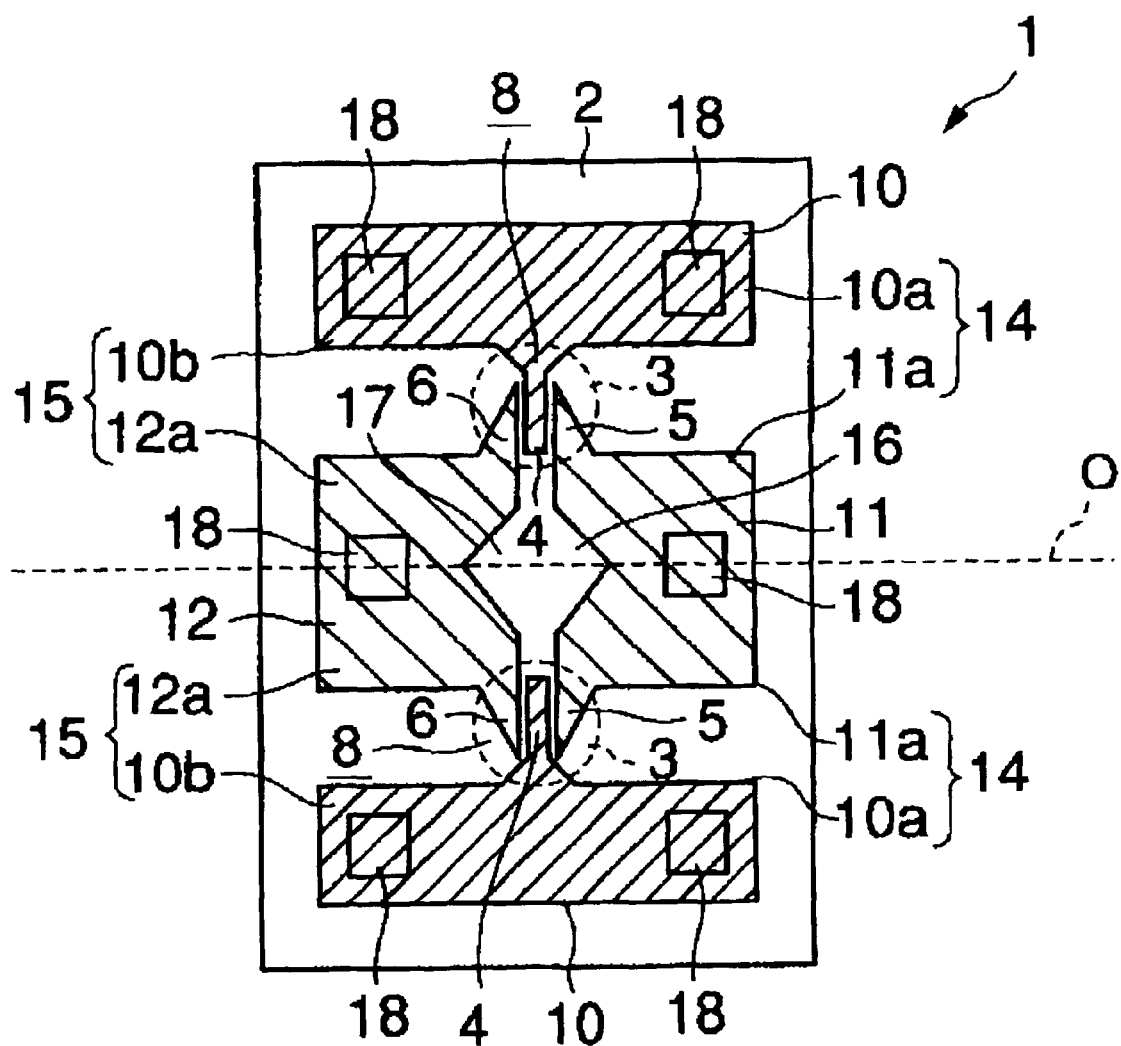
FIG. 3 is a plan view schematically showing a feature electrode pattern in a field-effect transistor device according to a second preferred embodiment of the present invention.

FIG. 3 schematically shows in a plan view a field-effect transistor device according to the second preferred embodiment of the present invention. In this second preferred embodiment, on the semiconductor substrate 2 of the FET device 1, a plurality of sets (two sets in the example of FIG. 3) of the gate electrode 4, the source electrode 5, and the drain electrode 6 are disposed on the same surface thereof, and the FET device 1 has a plurality (e.g. two in the example of FIG. 3) of the FET portions 8. Furthermore, on the semiconductor substrate 2, a gate-connection-line electrode 10, a source-connection-line electrode 11, and a drain-connection-line electrode 12, which are the same as those in the first preferred embodiment, corresponding to each FET portion 8, are provided, and a slot line on the input side and a slot line on the input side, corresponding to each FET portion 8, are provided.

In the second preferred embodiment, the entire electrode pattern of a plurality of sets of the gate electrode 4, the source electrode 5, the drain electrode 6, the gate-connection-line electrode 10, the source-connection-line electrode 11, and the drain-connection-line electrode 12 is a pattern shape which is line symmetrical with respect to the center line O that is substantially perpendicular to the direction in which the FET portions 8 are arranged in that entire electrode pattern.

Also, in the second preferred embodiment, similarly to the first preferred embodiment, the gate electrode 4 preferably has a shape which extends along the direction that is substantially perpendicular to the conduction direction of the signal through the slot lines 14 and 15. As a result, as described in the first preferred embodiment, the phase of the signal becomes nearly in phase at any place within the gate electrode 4, and the problem resulting from the phase difference of the signal within the gate electrode 4, that is, the problem of the gain being decreased, is reliably prevented.

Similar to the first preferred embodiment, cut-out portions 16 and 17 are formed in the source-connection-line electrode 11 and the drain-connection-line electrode 12 which are adjacent to each other, making it possible to prevent undesired coupling between the source-connection-line electrode 11 and the drain-connection-line electrode 12.

Figure 4:
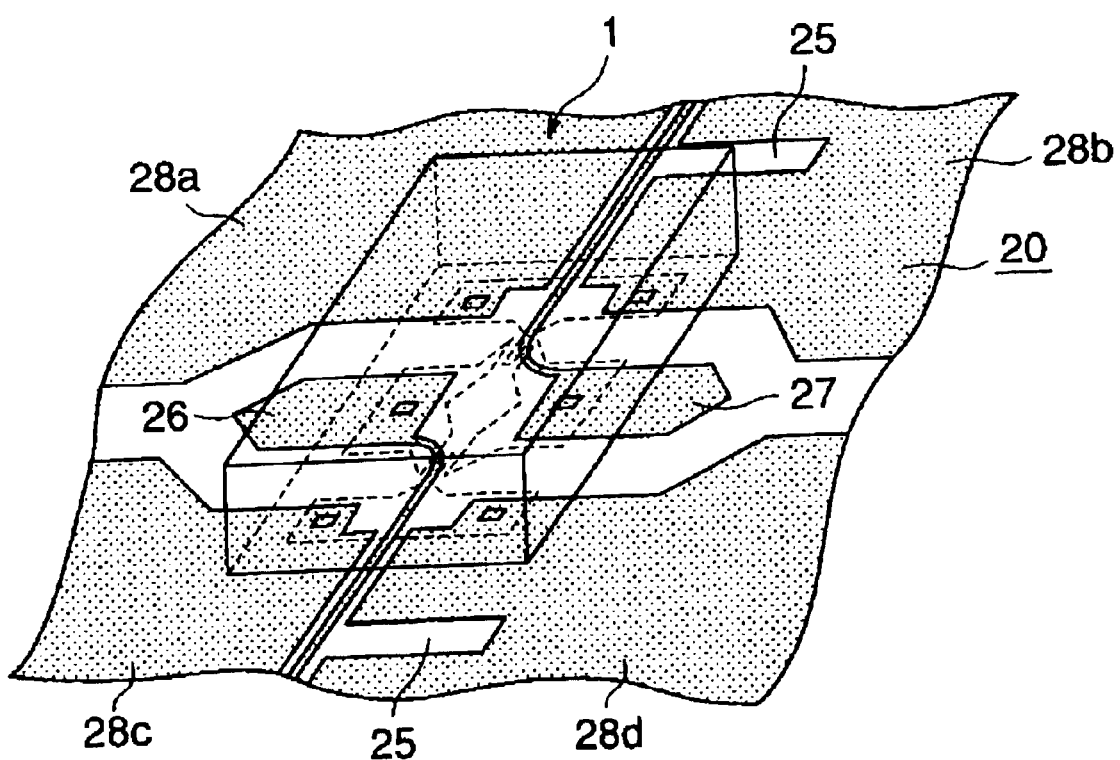
FIG. 4 shows in a simplified manner an example of a mounting structure of the field-effect transistor device according to the second preferred embodiment of the present invention.

FIG. 4 schematically shows an example of a mounting structure of the FET device 1 according to the second preferred embodiment of the present invention. In the example shown in FIG. 4, electrode patterns for forming slot lines by which a plurality of FET portions 8 are connected in parallel are disposed on the circuit substrate 20. More specifically, on the circuit substrate 20, electrode patterns 26, 27, 28a, 28b, 28c, and 28d for defining a slot line on the input side and a slot line on the output side, corresponding to each FET portion 8, are formed. Furthermore, the electrode patterns 28a, 28b, 28c, and 28d define a slot line to which the slot lines on the input side, corresponding to each FET portion 8, are commonly connected, and a slot line to which the slot lines on the output side, corresponding to each FET portion 8, are commonly connected. The slot lines disposed on the circuit substrate 20 cause the input signal to be supplied to each FET portion 8 in a shunted manner, and the signal output from each FET portion 8 is output to the corresponding slot line on the output side of the circuit substrate 20 and is joined, and electrical current is supplied to a predetermined supply portion.

In the second preferred embodiment, since a plurality of FET portions 8 are disposed on the same semiconductor substrate 2, the following advantages are obtained. For example, when a plurality of FET portions 8 need to be incorporated in a circuit, it is possible to use a plurality of FET devices 1 in which one FET portion 8 is formed. However, in this case, there is a risk in that the characteristics of the FET portion 8 of each FET device 1 may vary due to the film-formation accuracy of the electrode pattern of the gate electrode 4, the source electrode 5, etc., and thus, an inconvenience occurs.

In contrast, in the second preferred embodiment, since a plurality of FET portions 8 can be formed at the same time, a plurality of FET portions 8 having almost the same characteristics can be formed. As a result, when a circuit is to be configured by using a plurality of FET portions 8, for example, the design of the circuit can be made easier.

Furthermore, in the second preferred embodiment, the entire electrode pattern disposed on the semiconductor substrate 2 of the FET device 1 has a shape which is line symmetrical with respect to the center line O that is substantially perpendicular to the direction in which the FET portions 8 are arranged, of that entire electrode pattern As a result, the following advantages are obtained.

Figure 5A:
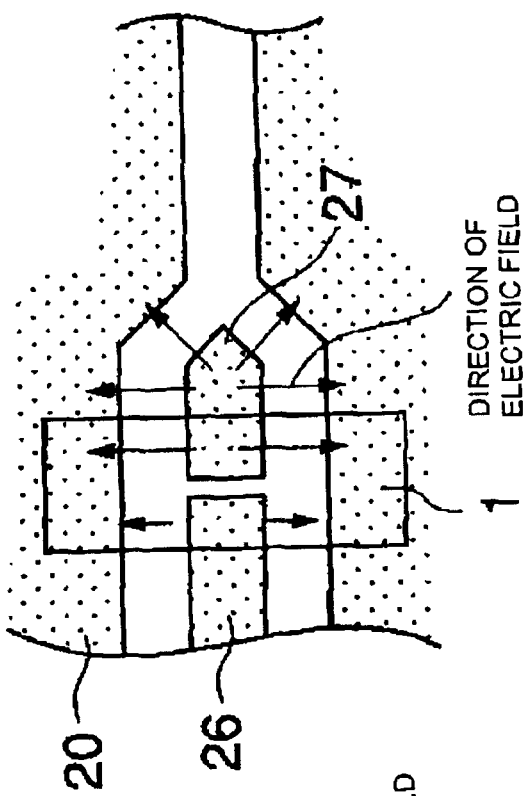
FIGS. 5A and 5B illustrate the advantages of the second preferred embodiment of the present invention.
Figure 5B:
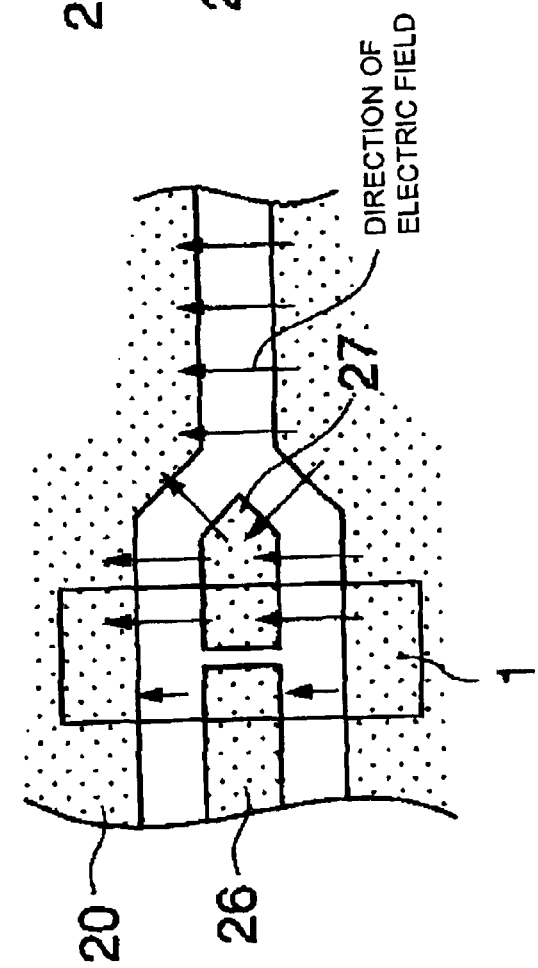

That is, in the signal, not only fundamental waves, but also harmonics which is one cause of the loss of fundamental waves, are generated due to various factors The harmonics can be broadly classified into an odd mode and an even mode. As in this second preferred embodiment, as a result of making the entire electrode pattern of the FET device 1 to have a shape which is line symmetrical with respect to the center line O that is substantially perpendicular to the direction in which the FET portions 8 are arranged, the direction of the electric field of each slot line of the circuit substrate 20 is as shown in FIG. 5A in the case of the odd mode and is as shown in FIG. 5B in the case of the even mode. For this reason, when the signals output from each FET portion 8 combine, as for the harmonics of the even mode, the harmonics are cancelled with each other and are removed. As a result, the loss of the fundamental waves due to the harmonics of the even mode can be reduced, and thus, the deterioration of the gain of the FET device 1 can be reduced.

The present invention is not limited to the first and second preferred embodiments, and can take various embodiments. For example, in the first and second preferred embodiments, the cutout portions 16 and 17 for increasing the space between the source-connection-line electrode 11 and the drain-connection-line electrode 12 are provided in both the source-connection-line electrode 11 and the drain-connection-line electrode 12, respectively. However, a cutout portion may be provided in one of the source-connection-line electrode 11 and the drain-connection-line electrode 12.

Furthermore, in the first and second preferred embodiments, the gate electrode 4 preferably has a shape which extends along the direction that is substantially perpendicular to the conduction direction of the signal through the slot line on the input side. However, for example, in a case where the gate electrode 4 cannot be disposed along the direction that is substantially perpendicular to the conduction direction of the signal through the slot line on the input side in the manner described above or in a case where characteristics which are more satisfactory than those from the gate electrode 4 which extends along the direction that is substantially perpendicular to the conduction direction of the signal through the slot line on the input side can be obtained, the gate electrode 4 may have a shape which extends in a direction that is inclined with respect to the conduction direction of the signal through the slot line on the input side.

Figure 6:
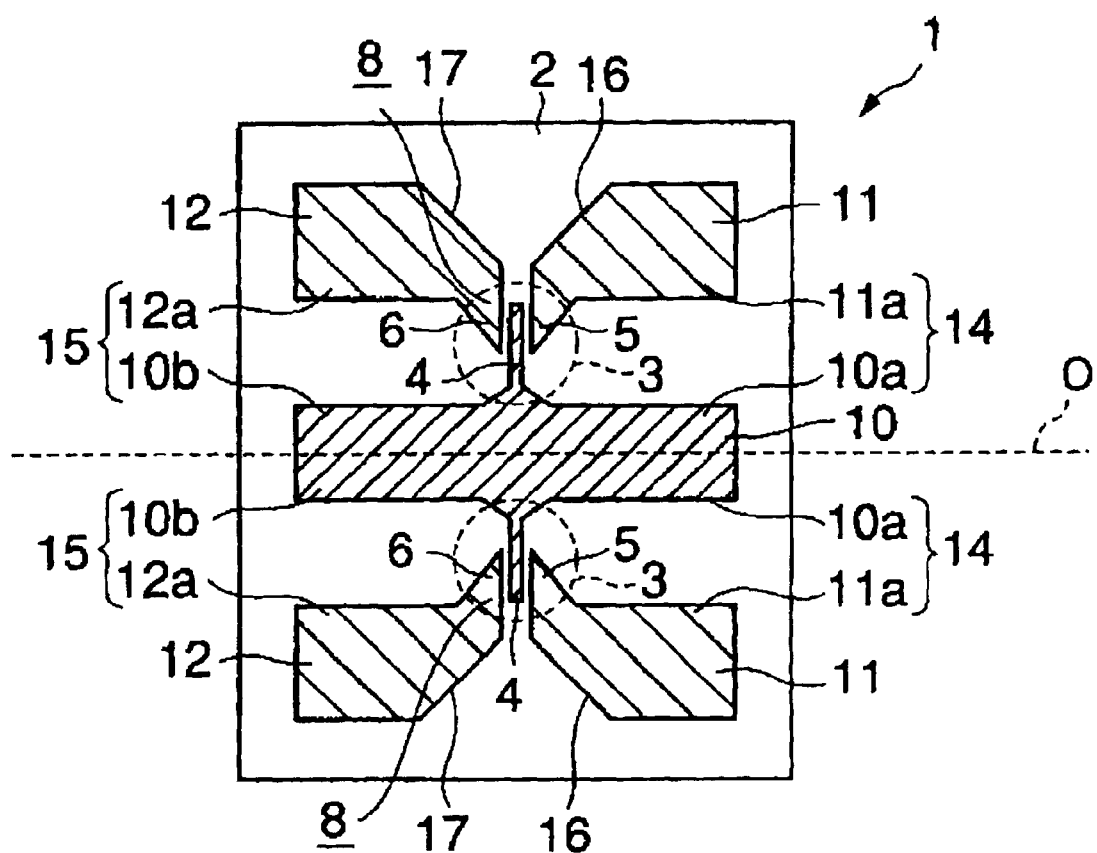
FIG. 6 illustrates another preferred embodiment of the present invention.

Furthermore, in the second preferred embodiment, each source electrode 5 of the two FET portions 8 is connected to the common source-connection-line electrode 11. Each drain electrode 6 of the two FET portions 8 is connected to the common drain-connection-line electrode 12. The respective gate electrodes 4 of the two FET portions 8 are connected to the corresponding individual gate-connection-line electrodes 10. However, for example, as shown in FIG. 6, the configuration may be such that the gate electrodes 4 of the two FET portions 8 are connected to the common gate-connection-line electrode 10, and each source electrode 5 and each drain electrode 6 of the two FET portions 8 are connected to the corresponding individual source-connection-line electrode 11 and drain-connection-line electrode 12.

Furthermore, although in the second preferred embodiment, an example in which two FET portions 8 are disposed on the semiconductor substrate 2 of the FET device 1 is described, of course, three or more FET portions 8 may be disposed on the surface of the same semiconductor substrate 2. Also, in this case, a slot line on the input side and a slot line on the input side, corresponding to each FET portion 8, are provided.

Figure 7:
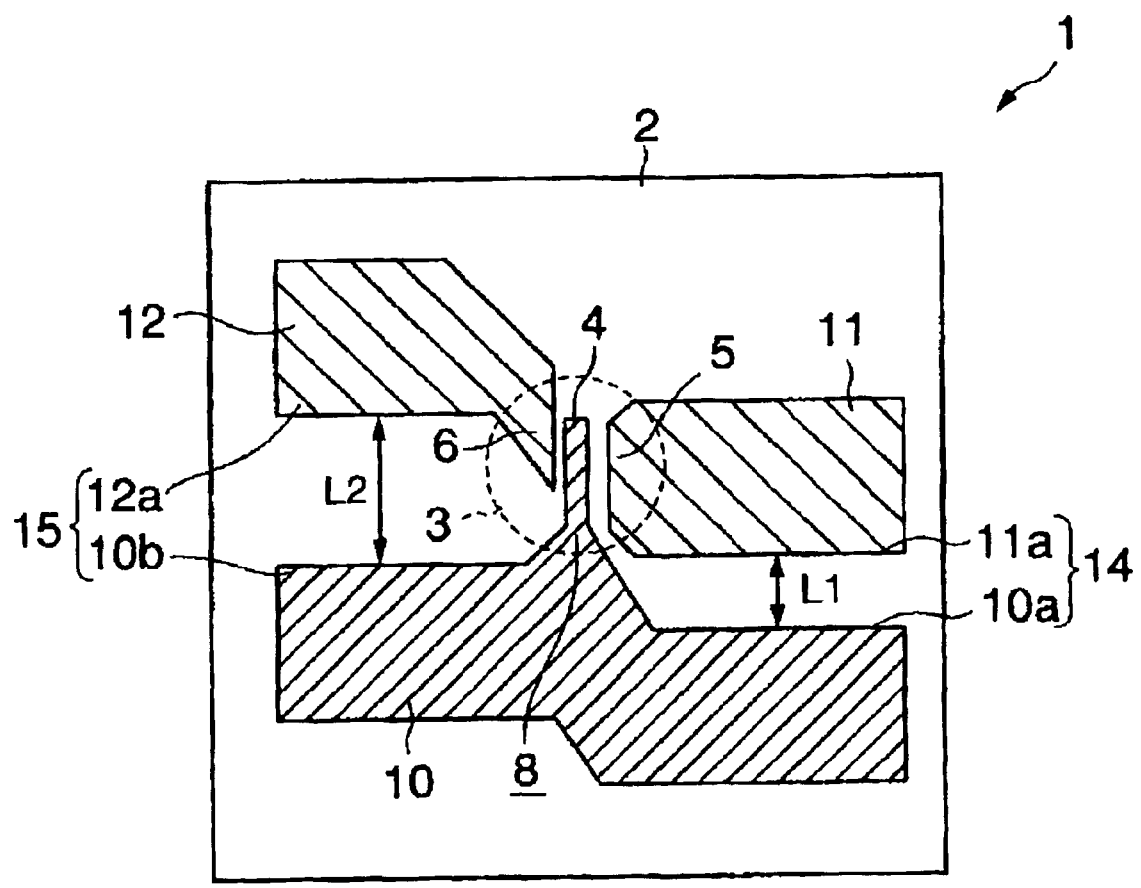
FIG. 7 illustrates still another preferred embodiment of the present invention.
Figures 8A, 8B:
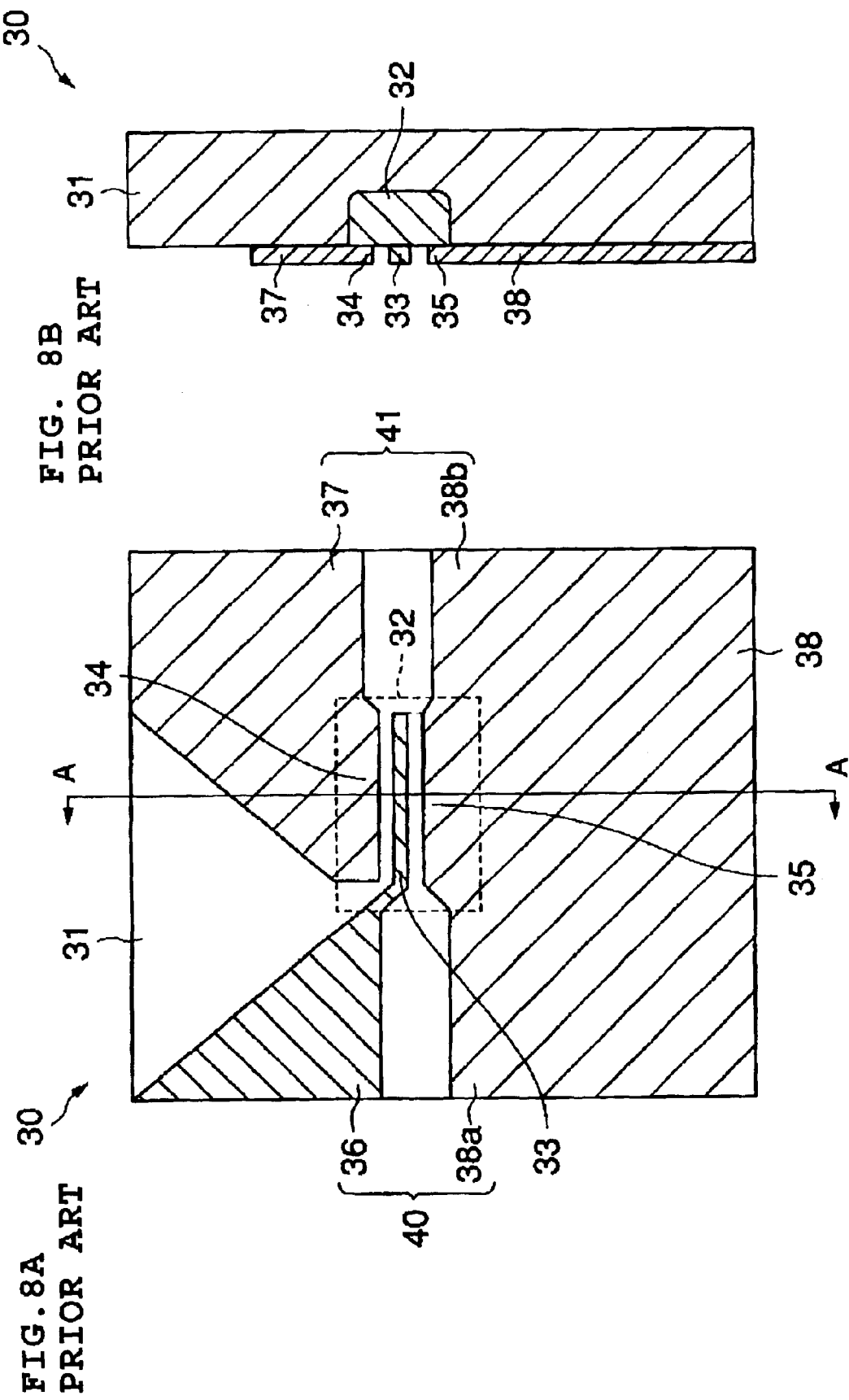
FIGS. 8A and 8B illustrate a model showing a conventional example of a field-effect transistor device.

Furthermore, although in the first and second preferred embodiments, the slot line on the input side of the FET portion 8 and the slot line on the output side thereof are arranged along the same straight line with the FET portion 8 in between, for example, as shown in FIG. 7, the slot lines 14 and 15 may not be arranged along the same straight line. Although in the first and second preferred embodiments, an example in which the space L1 between the electrodes 10a and 11a which define the slot line 14 is almost equal to the space L2 between the electrodes 10b and 12a which define the slot line 15 is described, as shown in FIG. 7, the space L1 between the electrodes 10a and 11a may differ from the space L2 between the electrodes 10b and 12a.

In addition, the electrode pattern of the circuit substrate 20 shown in the first and second preferred embodiments is only an example, and the shape of the electrode pattern of the mounting area of the FET device 1 in the circuit substrate 20 can take an appropriate shape according to the circuit configuration disposed on the circuit substrate 20.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A field-effect transistor device comprising:
   a semiconductor substrate;
   a field-effect transistor portion including;
      a gate electrode;
      a source electrode; and
      a drain electrode, said gate electrode, said source electrode, and said drain electrode being disposed on a surface of an active area provided on the semiconductor substrate, and said source electrode and said drain electrode being arranged to sandwich the gate electrode with a space defined therebetween;
   an electrode defining a line for connection to the gate electrode;
   an electrode defining a line for connection to the source electrode, said gate-connection-line electrode and said source-connection-line electrode being arranged such that respective portions thereof oppose each other with a space defined therebetween; and an electrode defining a line for connection to the drain electrode, said drain-connection-line electrode being arranged in such a manner that a portion thereof opposes said gate-connection-line electrode with a space provided therebetween, and said gate-connection-line electrode, said source-connection-line electrode, and said drain-connection-line electrode being arranged on the surface of the semiconductor substrate which is coplanar with respect to the surface on which the gate electrode, the source electrode, and the drain electrode are provided;

wherein one of the electrode pair portion where said gate-connection-line electrode opposes said source-connection-line electrode and the electrode pair portion where said gate-connection-line electrode opposes said drain-connection-line electrode defines a input-side slot line on the input side for inputting a signal to said field-effect transistor portion and the other of the electrode pair portion where said gate-connection-line electrode opposes said source-connection-line electrode and the electrode pair portion where said gate-connection-line electrode opposes said drain-connection-line electrode defines an output-side slot line on the output side from which a signal is output from said field-effect transistor portion;

said gate electrode has a shape which extends along a direction that is substantially perpendicular to the conduction direction of the signal flowing through the slot line on the input side; and the input-side slot line and the output-side slot line are arranged along approximately the same straight line such that the field-effect transistor portion is disposed therebetween.

2. A field-effect transistor device according to claim 1, wherein the source-connection-line electrode and the drain-connection-line electrode are arranged adjacent to each other with a space provided therebetween, and a cutout portion is formed in at least one of the electrode portion on the drain-connection-line electrode side in the source-connection-line electrode and the electrode portion on the source-connection-line electrode side in the drain-connection-line electrode, such that the space between the source-connection-line electrode and the drain-connection-line electrode is increased.

3. A field-effect transistor device according to claim 2, wherein the input-side slot line and the output-side slot line are arranged along approximately the same straight line such that the field-effect transistor portion is disposed therebetween.

4. A field-effect transistor device according to claim 1, wherein a plurality of sets of the gate electrode, the source electrode, and the drain electrode are disposed on the same surface of the semiconductor substrate, the field-effect transistor device includes a plurality of field-effect transistor portions, and a said input-side slot line and said output-side slot line, corresponding to each of the plurality of field-effect transistor portions, are disposed on the semiconductor substrate.

5. A field-effect transistor device according to claim 2, wherein a plurality of sets of the gate electrode, the source electrode, and the drain electrode are disposed on the same surface of the semiconductor substrate, the field-effect transistor device includes a plurality of field-effect transistor portions, and said input-side slot line and said output-side slot line, corresponding to each of the plurality of field-effect transistor portions, are disposed on the semiconductor substrate.

6. A field-effect transistor device according to claim 4, wherein an even number of field-effect transistor portions are arranged with a space provided therebetween on the semiconductor substrate, and the entire electrode pattern of a plurality of sets of the gate electrode, the source electrode, and the drain electrode, the gate-connection-line electrode, the source-connection-line electrode, and the drain-connection-line electrode, which are disposed on the surface of the semiconductor substrate, has a pattern shape which is approximately line symmetrical with respect to a center line of the entire electrode pattern, which is substantially perpendicular to a direction in which the field-effect transistor portions are arranged.

7. A field-effect transistor device according to claim 5, wherein an even number of field-effect transistor portions are arranged with a space provided therebetween on the semiconductor substrate, and the entire electrode pattern of a plurality of sets of the gate electrode, the source electrode, and the drain electrode, the gate-connection-line electrode, the source-connection-line electrode, and the drain-connection-line electrode, which are disposed on the surface of the semiconductor substrate, has a pattern shape which is approximately line symmetrical with respect to a center line of that entire electrode pattern, which is substantially perpendicular to a direction in which the field-effect transistor portions are arranged.

8. A field-effect transistor device according to claim 1, wherein the active area is located in an approximately central portion of the semiconductor substrate.

9. A field-effect transistor device according to claim 1, wherein the gate-connection-line electrode is defined by an electrode which is grounded.

10. A field-effect transistor device comprising:
a semiconductor substrate;
a field-effect transistor portion including;
    a gate electrode;
    a source electrode; and
    a drain electrode, said gate electrode, said source electrode, and said drain electrode being disposed on a surface of an active area provided on the semiconductor substrate, and said source electrode and said drain electrode being arranged to sandwich the gate electrode with a space defined therebetween;
an electrode defining a line for connection to the gate electrode;
an electrode defining a line for connection to the source electrode, said gate-connection-line electrode and said source-connection-line electrode being arranged such that respective portions thereof oppose each other with a space defined therebetween; and
an electrode defining a line for connection to the drain electrode, said drain-connection-line electrode being arranged in such a manner that a portion thereof opposes said gate-connection-line electrode with a space provided therebetween, and said gate-connection-line electrode, said source-connection-line electrode, and said drain-connection-line electrode being arranged on the surface of the semiconductor substrate which is coplanar with respect to the surface on which the gate electrode, the source electrode, and the drain electrode are provided;

wherein one of the electrode pair portion where said gate-connection-line electrode opposes said source-connection-line electrode and the electrode pair portion where said gate-connection-line electrode opposes said drain-connection-line electrode defines an input-side slot line on the input side for inputting a signal to said field-effect transistor portion and the other of the electrode pair portion where said gate-connection-line electrode opposes said source-connection-line electrode and the electrode pair portion where said gate-connection-line electrode opposes said drain-connection-line electrode defines an output-side slot line on the output side from which a signal is output from said field-effect transistor portion; and said gate electrode has a shape which extends alone a direction that is inclined with respect to the conduction direction of the signal flowing through the slot line on the input side; and the input-side slot line and the output-side slot line are arranged along approximately the same straight line such that the field-effect transistor portion is disposed therebetween.

11. A field-effect transistor device according to claim 1, wherein the source-connection-line electrode and the drain-connection-line electrode are arranged adjacent to each other with a space provided therebetween, and a cut-out portion is formed in at least one of the electrode portion on the drain-connection-line electrode side in the source-connection-line electrode and the electrode portion on the source-connection-line electrode side in the drain-connection-line electrode, such that the space between the source-connection-line electrode and the drain-connection-line electrode is increased.

12. A field-effect transistor device according to claim 11, wherein the input-side slot line and the output-side slot line are arranged along approximately the same straight line such that the field-effect transistor portion is disposed therebetween.

13. A field-effect transistor device according to claim 10, wherein a plurality of sets of the gate electrode, the source electrode, and the drain electrode are disposed on the same surface of the semiconductor substrate, the field-effect transistor device includes a plurality of field-effect transistor portions, and a said input-side slot line and said output-side slot line, corresponding to each of the plurality of field-effect transistor portions, are disposed on the semiconductor substrate.

14. A field-effect transistor device according to claim 11, wherein a plurality of sets of the gate electrode, the source electrode, and the drain electrode are disposed on the same surface of the semiconductor substrate, the field-effect transistor device includes a plurality of field-effect transistor portions, and said input-side slot line and said output-side slot line, corresponding to each of the plurality of field-effect transistor portions, are disposed on the semiconductor substrate.

15. A field-effect transistor device according to claim 13, wherein an even number of field-effect transistor portions are arranged with a space provided therebetween on the semiconductor substrate, and the entire electrode pattern of a plurality of sets of the gate electrode, the source electrode, and the drain electrode, the gate-connection-line electrode, the source-connection-line electrode, and the drain-connection-line electrode, which are disposed on the surface of the semiconductor substrate, has a pattern shape which is approximately line symmetrical with respect to a center line of the entire electrode pattern, which is substantially perpendicular to a direction in which the field-effect transistor portions are arranged.

16. A field-effect transistor device according to claim 14, wherein an even number of field-effect transistor portions are arranged with a space provided therebetween on the semiconductor substrate, and the entire electrode pattern of a plurality of sets of the gate electrode, the source electrode, and the drain electrode, the gate-connection-line electrode, the source-connection-line electrode, and the drain-connection-line electrode, which are disposed on the surface of the semiconductor substrate, has a pattern shape which is approximately line symmetrical with respect to a center line of that entire electrode pattern, which is substantially perpendicular to a direction in which the field-effect transistor portions are arranged.

17. A field-effect transistor device according to claim 10, wherein the active area is located in an approximately central portion of the semiconductor substrate.

18. A field-effect transistor device according to claim 10, wherein the gate-connection-line electrode is defined by an electrode which is grounded.

* * * * *